US007091740B2

(12) United States Patent
Simons

(10) Patent No.: US 7,091,740 B2
(45) Date of Patent: Aug. 15, 2006

(54) WRITE PROTECTION USING A TWO SIGNAL CONTROL PROTOCOL FOR AN INTEGRATED CIRCUIT DEVICE HAVING PARAMETER CHANGE CAPABILITY, CHIP SELECT AND SELECTABLE WRITE TO NON-VOLATILE MEMORY

(75) Inventor: James Simons, Scottsdale, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 25 days.

(21) Appl. No.: 10/954,584

(22) Filed: Sep. 30, 2004

(65) Prior Publication Data

US 2006/0022707 A1 Feb. 2, 2006

Related U.S. Application Data

(60) Provisional application No. 60/593,035, filed on Jul. 30, 2004.

(51) Int. Cl.
*H03K 19/00* (2006.01)
*G06F 12/00* (2006.01)
(52) U.S. Cl. ............................ 326/8; 711/163; 365/195
(58) Field of Classification Search ................ 326/59; 365/185.04, 185.33; 711/163, 220
See application file for complete search history.

(56) References Cited

U.S. PATENT DOCUMENTS

| 5,649,159 A * | 7/1997 | Le et al. ...................... 711/163 |
| 5,845,332 A * | 12/1998 | Inoue et al. ................. 711/163 |
| 6,031,757 A * | 2/2000 | Chuang et al. ........ 365/185.04 |
| 6,385,074 B1 * | 5/2002 | Johnson et al. ............. 365/103 |
| 6,556,476 B1 * | 4/2003 | Na ......................... 365/185.04 |
| 6,757,832 B1 | 6/2004 | Silverbrook et al. ........ 713/194 |
| 2006/0023543 A1 * | 2/2006 | Simons ...................... 365/222 |

FOREIGN PATENT DOCUMENTS

EP        0581253         7/1993

OTHER PUBLICATIONS

International Search report and Written Opinion; PCT/US2005/031917; pp. 10.

* cited by examiner

*Primary Examiner*—Vibol Tan
(74) *Attorney, Agent, or Firm*—Baker Botts L.L.P.

(57) ABSTRACT

An integrated circuit having a device with an adjustable parameter utilizes a two signal control protocol to select the device, change the parameter value with or without saving the parameter value in a non-volatile memory, and to write protect the parameter value in the non-volatile memory.

35 Claims, 4 Drawing Sheets

WRITE PROTECTION USING A TWO SIGNAL CONTROL PROTOCOL FOR AN INTEGRATED CIRCUIT DEVICE HAVING PARAMETER CHANGE CAPABILITY, CHIP SELECT AND SELECTABLE WRITE TO NON-VOLATILE MEMORY

RELATED PATENT APPLICATIONS

This application claims priority to commonly owned U.S. Provisional Patent Application Ser. No. 60/593,035; filed Jul. 30, 2004; and U.S. patent application Ser. No. 10/946,432; filed Sep. 21, 2004; both entitled "Increment/Decrement, Chip Select And Selectable Write To Non-Volatile Memory Using a Two Signal Control Protocol for an Integrated Circuit Device," by James Simons; and which are hereby incorporated by reference herein for all purposes.

TECHNICAL FIELD OF THE INVENTION

The invention relates generally to digital integrated circuit devices having non-volatile memory, and, more particularly, to write protection of a non-volatile memory in a device having a two signal protocol.

BACKGROUND OF THE RELATED TECHNOLOGY

Integrated circuit devices are becoming smaller and with fewer signal leads for both cost and space considerations. Typically an integrated circuit device may be in an integrated circuit package having five to eight pins. At least two of these pins must be used for power and ground, e.g., $V_{DD}$ and $V_{SS}$, respectively. This leaves only three to six pins for useful signal and control purposes. When a plurality of integrated circuit devices, either on a single integrated circuit die or on multiple dice, are in an integrated circuit package, more pins may be used but are still limited due to the number of device functions.

Typical integrated circuit devices whose parameter values are increased and decreased are, for example, digital rheostat, digital potentiometer, digital counter, programmable gain amplifier, modulo N-frequency divider, and digital-to-analog converter (DAC). What is commonly required for these incremental/decremental dependent devices is some way to control incrementing and decrementing the parameter values used by the device. Another desirable feature in these devices is storage in a non-volatile memory of the last parameter value used before power is removed from the device or to protect against a corrupting event such as static discharge or radio frequency interference (RFI). Non-volatile memory may be, for example, one time programmable (OTP) electrically programmable read only memory (EPROM), electrically erasable and programmable read only memory (EEPROM), FLASH memory and the like.

A low pin count device must maximize functionality for each pin of the integrated circuit package. As such, a two (2) wire up/down protocol may use, for example, signal control pins of up/down (U/D) and chip select (CS). However, when using non-volatile memory in such a device, write protection is needed so that the possibility of noise on the U/D and/or CS signals will not cause a desired value stored in the non-volatile memory to be unintentionally incremented or decremented. An unintentional change of a desired value stored in the non-volatile memory could result in a catastrophic application failure. In additional, write protection can insure that factory calibration of a value in the non-volatile memory will remain intact even if the U/D and/or CS signals are not static (intentionally or unintentionally). Generally, a write protection function will require an additional signal pin, e.g., WR or WP pin. Thus the write protection function uses a valuable signal pin of a low pin count integrated circuit package.

What is needed is write protection for an integrated circuit device having incrementing and decrementing parameter values that can be stored in non-volatile memory such that only two signal nodes or pins are required for all of these functions, including write protection of the non-volatile memory.

SUMMARY OF THE INVENTION

The invention overcomes the above-identified problems as well as other shortcomings and deficiencies of existing technologies by providing hardware and software methods, systems and apparatus for an integrated circuit device having parameter values that can be stored in a non-volatile memory and that can be write protected such that only two signal nodes or pins are required for all functions, including write protection of the non-volatile memory. The integrated circuit device may be, for example but not limited to, a digital rheostat, digital potentiometer, digital counter, programmable gain amplifier, modulo N-frequency divider, digital-to-analog converter (DAC) and the like. The invention has application to any electronic circuit that has a parameter(s), e.g., incrementing and decrementing, that changes then is saved in a non-volatile memory so as to retain the value of the parameter when power is removed from the integrated circuit device.

According to a specific exemplary embodiments of the invention, an up/down or increment/decrement (hereinafter "U/D") control signal and a chip select (hereinafter "CS") control signal may be used in combination for incrementing and decrementing parameters of an integrated circuit device and for selectively saving the parameters in non-volatile memory. Incrementing and decrementing parameters of the integrated circuit device may be performed without saving the parameters in non-volatile memory, or the parameter(s) may be saved after the increment or decrement to the parameter is performed. The U/D and CS control signals may be at either a first logic level or a second logic level, independently of each other. The U/D and CS control signals may also be "active low" (enabled when at a logic low), "active high" (enabled when at a logic high) or any combination thereof and independently of each other. In addition, the first and second logic levels will be at substantially first and second voltages, respectively, or visa versa. The first voltage will be less than the second voltage, e.g., the first voltage may be, for example, from about zero (0) volts to about 0.7 volts and the second voltage may be, for example, from about 2.7 volts to about 5.5 volts.

The specific exemplary embodiments of the invention further provides for a write protect lock function of the non-volatile memory that may be used to effectively lock-out (ignore) transitions of the U/D and CS control signals as they would affect writing to the non-volatile memory until at least one of the two control signals, e.g., the CS control signal, is driven to a third logic level at substantially a third voltage. The third voltage is greater than the second voltage, e.g., the third voltage may be, for example, greater than about 7 volts. Use of a higher threshold voltage level for the third voltage than the second and first voltages is also advantageous in preventing unintentional alterations of the increment/decrement value stored in the non-volatile memory by noise or intentional low voltage (first and second logic levels) transitions of the U/D and CS signals.

The write protect lock function may be implemented as a write protect (WP) bit that may be set or cleared by a combination of logic levels and transitions thereof for at least one of the two U/D and CS signals. For example, the lower voltage (first and second logic levels at the first and second voltages, respectively) increment/decrement commands on U/D and CS are substantially similar to high voltage increment/decrement commands on U/D and CS except that CS is now at the third logic level (third voltage). When the CS control signal is at the third logic level and transitions back to the second logic level the WP bit may be set or cleared to write protect or write enable, respectively, the non-volatile memory as more fully described herein.

For ease in the following explanation of how the specific exemplary embodiments operate for changing parameter values, e.g., incrementing and decrementing, storing a parameter value in non-volatile memory, and write protecting or write enabling the non-volatile memory, a transition from the first logic level to the second logic level will be referred to as a "rising edge" and a transition from the second logic level to the first logic level will be referred to as a "falling edge." Similarly, a transition from the second logic level to the third logic level will be referred to as a "plus rising edge" and a transition from the third logic level to the second logic level will be referred to as a "plus falling edge."

The CS control signal selects a specific integrated circuit device when it goes from the second logic level to the first logic level (falling edge). The logic level at which the U/D control signal is at upon a CS control signal falling edge determines whether the integrated circuit device will increment (U/D control signal at the second logic level upon a CS control signal falling edge) or decrement (U/D control signal at the first logic level upon a CS control signal falling edge) on each subsequent rising edge of the U/D control signal logic level transitions. Other forms of parameter changes may be accomplished via any two wire serial bus protocol, e.g., I$^2$C, etc.

A write to non-volatile memory of the latest parameter value will occur if the U/D logic levels at the falling edge and the subsequent rising edge of the CS control signal are different logic levels. If the U/D logic levels are the same at both the falling edge and the subsequent rising edge of the CS control signal, then a write to non-volatile memory will not occur. This gives the present invention the ability to control the device parameter without having to perform a long time duration write to non-volatile memory every time the CS control signal deselects the integrated circuit device. Thus, writing the latest device parameter to the non-volatile memory may be performed independently of any parameter changes made during the selection of the device by the CS control signal. A great deal of power and device latency time may be saved by only writing to the non-volatile memory when appropriate. Reducing the number of times a non-volatile memory is written to will increase its useful operating life.

For example, if the first logic level is represented by "0", the second logic level is represented by "1", a rising edge transition by "↑" and a falling edge transition by "↓". For the decrement mode—U/D=0 and ↓CS; thereafter CS=0, and for each ↑U/D the parameter will decrement by one unit. If U/D=1 when ↑CS then there will be a write to non-volatile memory of the last decrement of the device parameter. However, if U/D=0 when ↑CS then there will not be a write to non-volatile memory. Similarly, for the increment mode—U/D=1 and ↓CS; thereafter CS=0, and for each ↑U/D the parameter will increment by one unit. If U/D=0 when ↑CS then there will be a write to non-volatile memory of the last increment of the device parameter. However, if U/D=1 when ↑CS then there will not be a write to non-volatile memory.

It is contemplated and within the scope of the invention that any combination of CS and U/D control signal logic level edge transition directions and logic levels may be used in performing the aforementioned control operations, according to the invention, e.g., the first logic level may be substituted for the second logic level and visa versa. In addition, rising edge transitions "↑" and falling edge transitions "↓" may be interchanged without affecting the operation of the invention.

As a further example in explaining enabling and disabling write protection of the non-volatile memory, when the CS control signal transitions from the second logic level to the third logic level, this plus rising edge transition will be represented by "$^+$↑CS" and when the CS control signal transitions back to the second logic level from third the logic level, this plus falling edge transition will be represented by "$^+$↓CS."

To enable write protection (write lock), the CS control signal is transitioned from the second logic level to the third logic level ($^+$↑CS), and then the CS control signal is transitioned back to the second logic level from the third logic level ($^+$↓CS). If the U/D control signal logic levels during the $^+$↑CS and $^+$↓CS transitions are different, e.g., U/D=1 at $^+$↑CS and U/D=0 at $^+$↓CS, or U/D=0 at $^+$↑CS and U/D=1 at $^+$↓CS, then the write protection lock function will be enabled (write protect "WP" bit set, e.g., to a logic 1).

To disable write protection (write lock), the CS control signal is transitioned from the second logic level to the third logic level ($^+$↑CS), and then the CS control signal is transitioned back to the second logic level from the third logic level ($^+$↓CS). If the U/D control signal logic levels during the $^+$↑CS and $^+$↓CS transitions are the same, e.g., U/D=1 at $^+$↑CS and U/D=1 at $^+$↓CS, or U/D=0 at $^+$↑CS and U/D=0 at $^+$↓CS, then the write protection lock function will be disabled (write protect "WP" bit cleared, e.g., to a logic 0).

It is contemplated and within the scope of the present invention that any two or more signal serial bus protocol may be utilized to change a parameter value(s), write the parameter value(s) to non-volatile memory, and enable and disable write protection of the non-volatile memory by utilizing any combination of three different logic levels on at least one of the two or more signal serial bus.

The integrated circuit device may be packaged in a low pin count package such as, for example, SOT-23-5, SOT-23-6, MSOP-8, SOIC-8 and the like.

Examples of digital potentiometers and rheostats are more fully described in commonly owned U.S. Pat. No. 6,201,491, by Brunolli, et al., issued Mar. 13, 2001, and is hereby incorporated by reference for all purposes.

A technical advantage of the invention is using only two signal nodes for changing a device parameter, writing or not writing the device parameter to non-volatile memory, write protection enabling and disabling of the non-volatile memory, and device selection of the integrated circuit device.

Another technical advantage is better noise tolerance and reduction of false triggering by using a higher voltage logic level to enable and disable write protection of the non-volatile memory.

Another technical advantage is minimizing the requirement for control signal pins in a low pin count package.

A technical feature of the invention is multifunction control signals used in various combinations for a plurality of control functions with a minimum number of different control signals.

Features and advantages of the invention will be apparent from the following description of the embodiments, given for the purpose of disclosure and taken in conjunction with the accompanying drawings.

BRIEF DESCRIPTION OF THE DRAWINGS

A more complete understanding of the present disclosure and advantages thereof may be acquired by referring to the following description taken in conjunction with the accompanying drawing, wherein.

Figure 1:
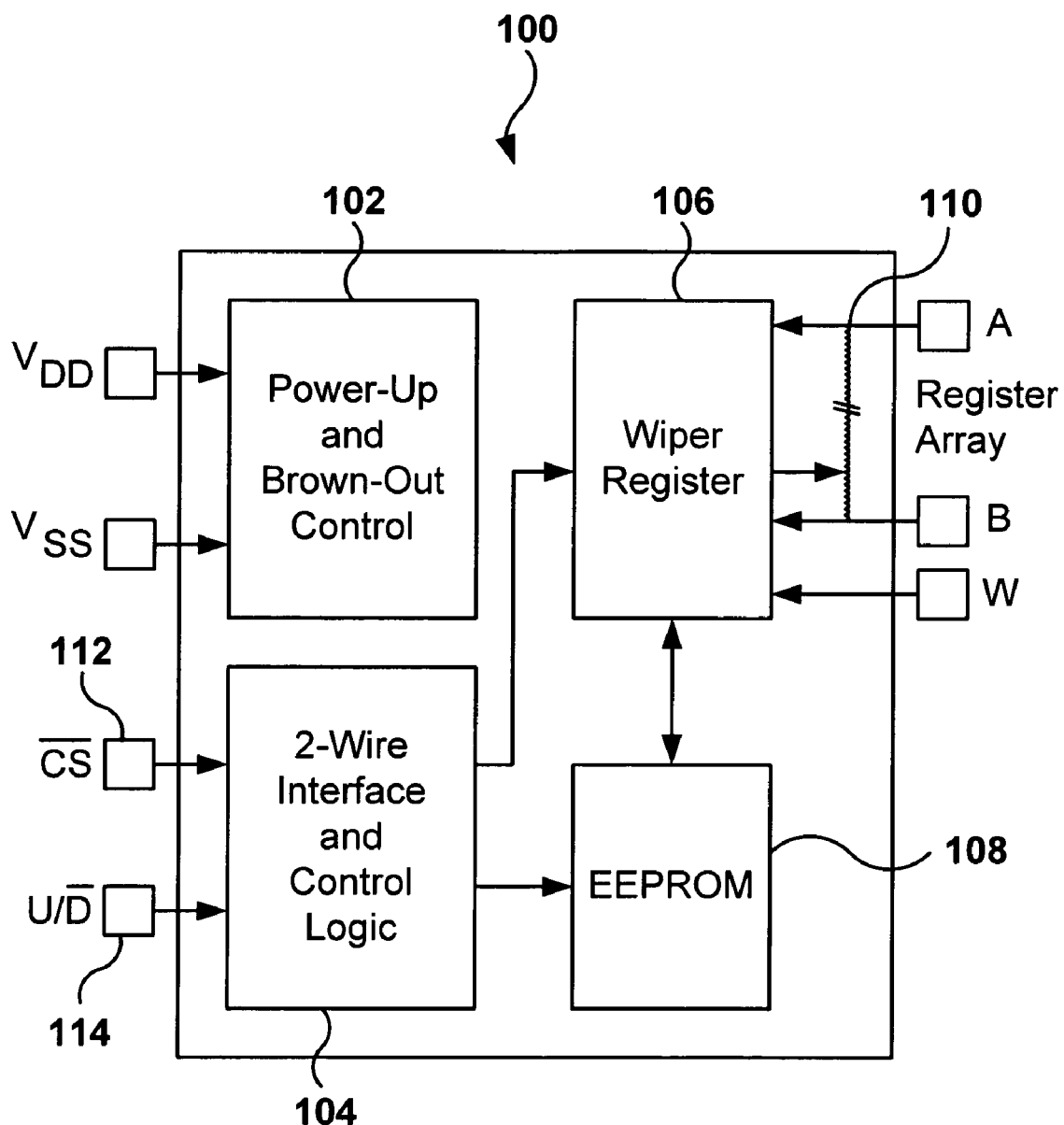
FIG. 1 illustrates a schematic block diagram of an integrated circuit device, according to an exemplary specific embodiment of the invention.
Figure 2:
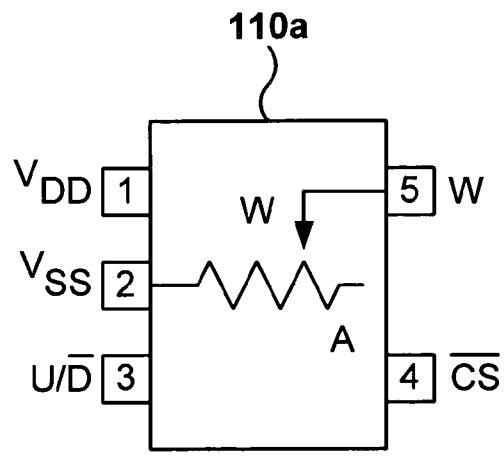
FIG. 2 illustrates a schematic diagram of a digital rheostat having a one end connected to power supply $V_{SS}$ and the wiper available for connection to an external circuit.
Figure 3:
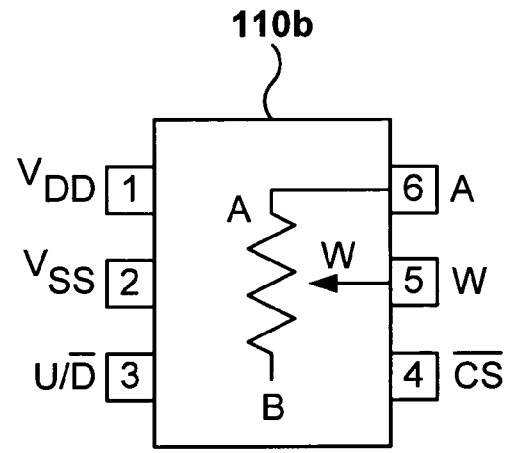
FIG. 3 illustrates a schematic diagram of a digital rheostat having a one end and the wiper available for connection to an external circuit.
Figure 4:
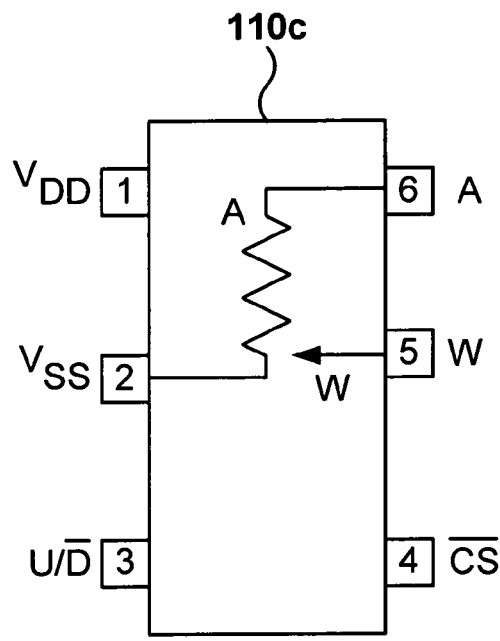
FIG. 4 illustrates a schematic diagram of a digital potentiometer having a first end connected to power supply $V_{SS}$, a second end and the wiper available for connection to an external circuit.
Figure 5:
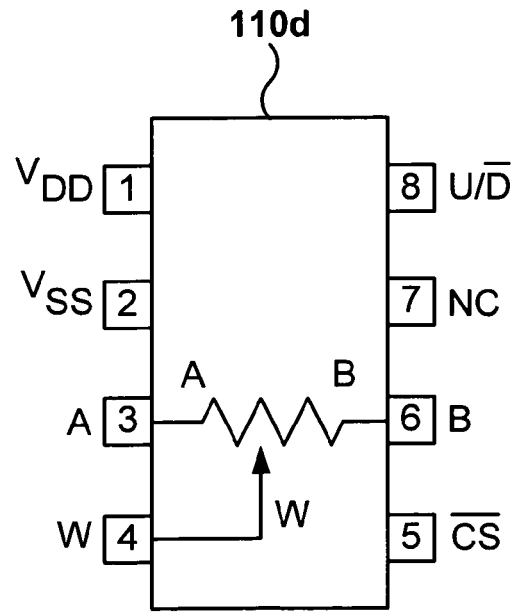
FIG. 5 illustrates a schematic diagram of a digital potentiometer having first and second ends, and the wiper available for connection to an external circuit.

While the present invention is susceptible to various modifications and alternative forms, specific exemplary embodiments thereof have been shown by way of example in the drawing and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

The present invention is directed to a method, system and apparatus for an integrated circuit device to increment and decrement parameters thereof, and selectively save the parameters in non-volatile memory by using a control protocol requiring only two signal nodes of the integrated circuit device.

Referring now to the drawing, the details of exemplary embodiments of the present invention are schematically illustrated. Like elements in the drawings will be represented by like numbers, and similar elements will be represented by like numbers with a different lower case letter suffix.

Referring now to FIG. 1, depicted is a schematic block diagram of an integrated circuit device, according to an exemplary specific embodiment of the invention. The integrated circuit device, generally represented by the numeral 100, may comprise power-up and brown-out control 102, 2-wire interface and control logic 104, wiper control (increment/decrement) register 106, non-volatile memory (e.g., OTP EPROM, EEPROM or FLASH) 108, and a device parameter 110 (e.g., digital rheostat, digital potentiometer, digital counter, programmable gain amplifier, modulo N-frequency divider, digital-to-analog converter (DAC) and the like).

The power-up and brown-out control 102 insures that the device powers up in a known condition and will not perform logic and control functions if the power supply voltage is too low.

The 2-wire interface and control logic 104 is adapted to receiver control signals, wherein each control signal may be at one of two logic levels, e.g., a first logic level ("0") that may be at substantially the same voltage as power supply $V_{SS}$, and a second logic level ("1") that may be at substantially the same voltage as power supply $V_{DD}$. The 2-wire interface and control logic 104 detects the received logic levels and also may determine when the input control signals transition from the first logic level to the second logic level (rising edge transition "↑") and from the second logic level to the first logic level (falling edge transition "↓"). The combination of logic levels received by the 2-wire interface and control logic 104, and the signal transition direction may be decoded for device selection, control of the device parameter, and selective writing of the parameter to the non-volatile memory 108. The device parameter may be controlled by the decrementing and incrementing the register 106 with the 2-wire interface and control logic 104. A chip select ("CS") input 112 may be used to select or enable the device 100. An up-down (increment/decrement) ("U/D") input 114 may be used for incrementing and decrementing the device parameter 110.

Referring now to FIGS. 2–5, depicted are schematic diagrams of various configurations for specific variable resistance devices, according to exemplary embodiments of the present invention. A rheostat generally has two nodes, A and W, between which is an adjustable resistance. A potentiometer generally has three nodes, A, B and W. A is a top node, B is a bottom node and W is a node coupled to an adjustable portion of the potentiometer resistance. Rheostat 110a, depicted in FIG. 2, has the B node connected to package pin 2, $V_{SS}$, and the W node connected to package pin 5 of the device 100. Rheostat 110b, depicted in FIG. 3, has the A node connected to package pin 6 and the W node connected to package pin 5 of the device 100. Potentiometer 110c, depicted in FIG. 4, has the A node connected to package pin 6, the W node connected to package pin 5 and the B node connected to package pin 2, $V_{SS}$, of the device 100. Potentiometer 110d, depicted in FIG. 5, has the A node connected to package pin 3, the W node connected to package pin 4 and the B node connected to package pin 6 of the device 100. $V_{DD}$ and $V_{SS}$ are power and ground, respectively, for each of the devices 100.

Figure 6:
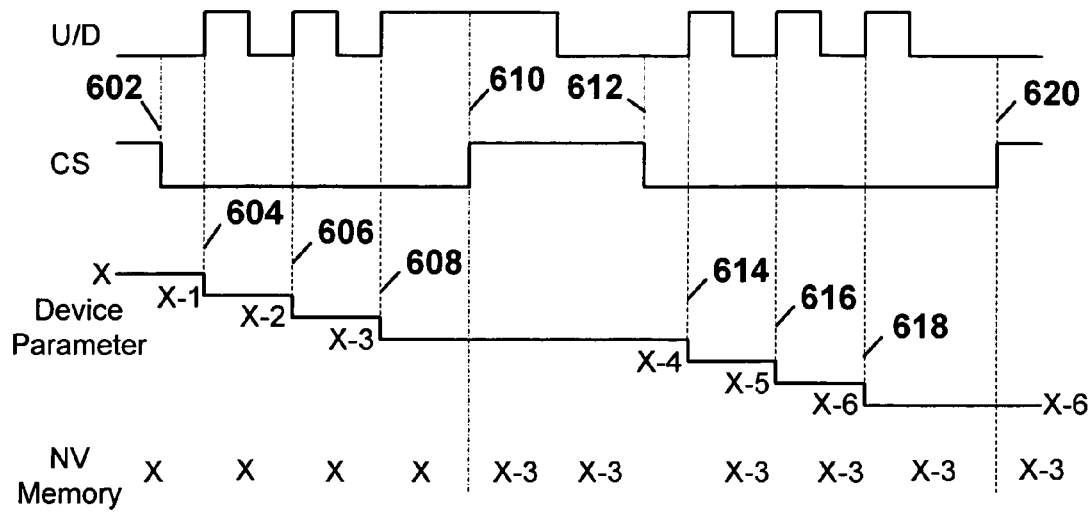
FIG. 6 illustrates a schematic signal diagram of a control signal sequence for decrementing a device parameter with and without the parameter being written to non-volatile memory, according to an exemplary specific embodiment of the invention.

The device 100 control protocol for the device parameter 110 is asserted by the combination of logic levels on the CS input 112 and U/D input 114, and transition directions thereof. Referring now to FIG. 6, depicted is a schematic signal diagram of a control signal sequence for decrementing a device parameter 110 with and without the parameter 110 value being written to the non-volatile (NV) memory 108. At time 602, U/D input 114 is at the first logic level and the CS input 112 is in a falling edge transition from the second to the first logic level. This indicates to the control logic 104 that the parameter 110 will be decremented on subsequent rising edge transitions of the U/D input 114 for so long as the CS input 112 is at the first logic level. At times 604, 606 and 608, the U/D input 114 has a rising edge transition and the parameter 110 is thereby decremented by three units. However, the parameter value stored in the non-volatile memory 108 remains at the original starting value (X). At time 610, the CS input 112 returns to the second logic level while the U/D input 114 is at the second logic level. This results in the last value (X−3) of the parameter 110 being written to the non-volatile memory 108.

At time 612, U/D input 114 is at the first logic level and the CS input 112 is in a falling edge transition from the second to the first logic level. This indicates to the control logic 104 that the parameter 110 will be decremented on subsequent rising edge transitions of the U/D input 114 for so long as the CS input 112 is at the first logic level. At times 614, 616 and 618, the U/D input 114 has a rising edge transition and the parameter 110 is thereby decremented by three units. At time 620, the CS input 112 returns to the second logic level while the U/D input 114 is at the first logic level. This results in no writing of the parameter 110 to the non-volatile memory 108. Thus, the non-volatile memory 108 will retain the last written (at 610) value (X−3).

Figure 7:
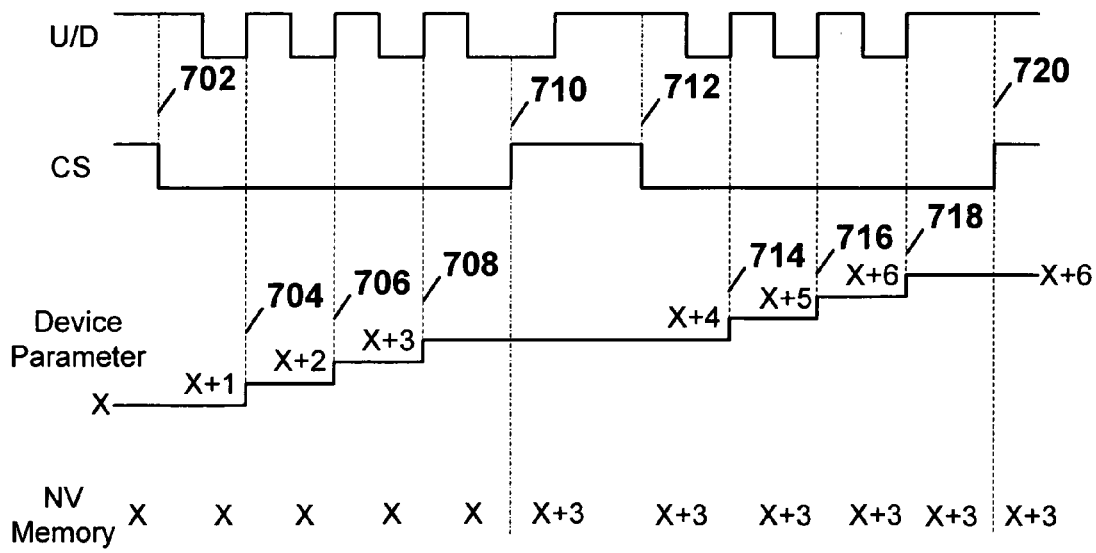
FIG. 7 illustrates a schematic signal diagram of a control signal sequence for incrementing a device parameter with and without the parameter being written to non-volatile memory, according to another exemplary specific embodiment of the invention.

Referring now to FIG. 7, depicted is a schematic signal diagram of a control signal sequence for incrementing a device parameter 110 with and without the parameter 110 value being written to the non-volatile memory 108. At time 702, U/D input 114 is at the second logic level and the CS input 112 is in a falling edge transition from the second to the first logic level. This indicates to the control logic 104 that the parameter 110 will be incremented on subsequent rising edge transitions of the U/D input 114 for so long as the CS input 112 is at the first logic level. At times 704, 706 and 708, the U/D input 114 has a rising edge transition and the parameter 110 is thereby incremented by three units (X+3). At time 710, the CS input 112 returns to the second logic level while the U/D input 114 is at the first logic level. This results in the last value (X+3) of the parameter 110 being written to the non-volatile memory 108.

At time 712, U/D input 114 is at the second logic level and the CS input 112 is in a falling edge transition from the second to the first logic level. This indicates to the control logic 104 that the parameter 110 will be incremented on subsequent rising edge transitions of the U/D input 114 for so long as the CS input 112 is at the first logic level. At times 714, 716 and 718, the U/D input 114 has a rising edge transition and the parameter 110 is thereby incremented by three units. At time 720, the CS input 112 returns to the second logic level while the U/D input 114 is at the second logic level. This results in no writing of the parameter 110 to the non-volatile memory 108. Thus, the non-volatile memory 108 will retain the last written (at 710) value (X+3).

Chip selection, incrementing and decrementing the device parameter 110, and independent control of writing the value of parameter 110 to a non-volatile memory 108 are performed with only two input signals, CS input 112 and U/D input 114. The present specific exemplary embodiment determines writing to the non-volatile memory 108 when the U/D input 114 is at different logic levels when the CS input 112 goes from the second logic level to the first logic level (falling transition) and then back to the second logic level (rising transition), however, it is contemplated and within the scope of the invention that the U/D input 114 being at the same logic level when the CS input 112 changes from the second logic level to the first logic level and then back to the first logic level that a write may be performed. Also, falling transitions of the U/D input may be used to increment and decrement the value of the parameter 110.

Figure 8A:
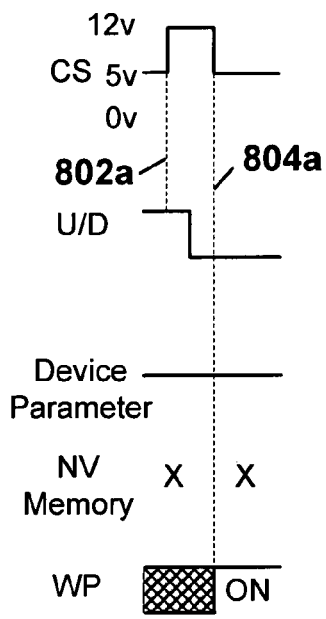
FIGS. 8a–8c illustrate schematic signal diagrams of control signal sequences for enabling write protection of the non-volatile memory.
Figure 8B:
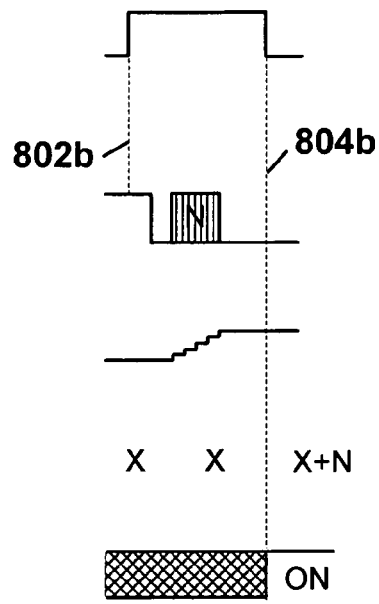
Figure 8C:
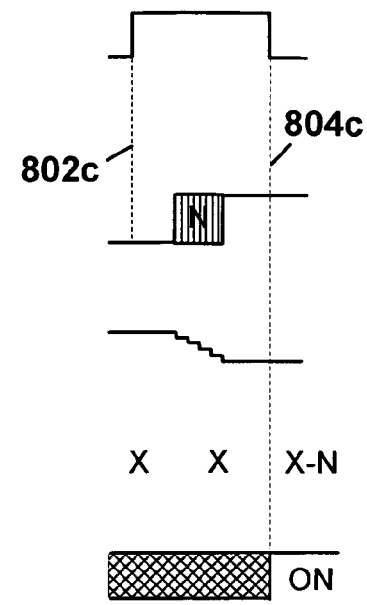

Referring now to FIGS. 8a–8c, depicted are schematic signal diagrams of control signal sequences for enabling write protection of the non-volatile memory. In FIG. 8a the CS input 112 and the U/D input 114 are both at the second logic level. At time 802a, the CS input 112 is in a rising edge transition from the second logic level to a third logic level (the third logic level being at a higher voltage than the second logic level). At time 804a, the CS input 112 is in a falling edge transition from the third logic level to the second logic level and the U/D input 114 is at the first logic level. Since the logic levels of the U/D input 114 were different at times 802a and 804a, write protection of the non-volatile memory is enabled. Since the device parameter 110 has not been changed between times 802a and 804a, the contents of the non-volatile memory 108 remain the same.

In FIG. 8b the CS input 112 and the U/D input 114 are both at the second logic level. At time 802b, the CS input 112 is in a rising edge transition from the second logic level to the third logic level. At time 804b, the CS input 112 is in a falling edge transition from the third logic level to the second logic level and the U/D input 114 is at the first logic level. Since the logic levels of the U/D input 114 were different at times 802b and 804b, write protection of the non-volatile memory is enabled. Since the device parameter 110 has been increased, e.g., incremented, by N units between times 802b and 804b, the contents of the non-volatile memory 108 are updated to the new parameter value.

In FIG. 8c the CS input 112 is at the second logic level and the U/D input 114 is at the first logic level. At time 802c, the CS input 112 is in a rising edge transition from the second logic level to the third logic level. At time 804c, the CS input 112 is in a falling edge transition from the third logic level to the second logic level and the U/D input 114 is at the second logic level. Since the logic levels of the U/D input 114 were different at times 802c and 804c, write protection of the non-volatile memory is enabled. Since the device parameter 110 has been decreased, e.g., decremented, by N units between times 802c and 804c, the contents of the non-volatile memory 108 are updated to the new parameter value.

Figure 9A:
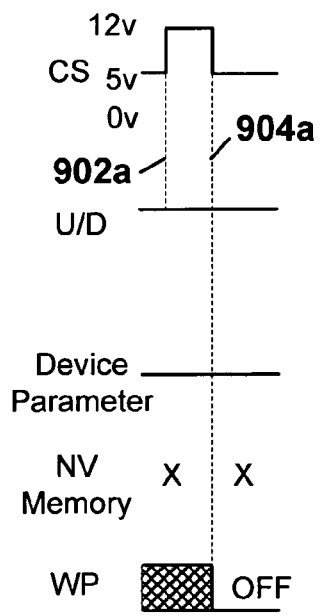
FIGS. 9a–9c illustrate schematic signal diagrams of control signal sequences for disabling write protection of the non-volatile memory.
Figure 9B:
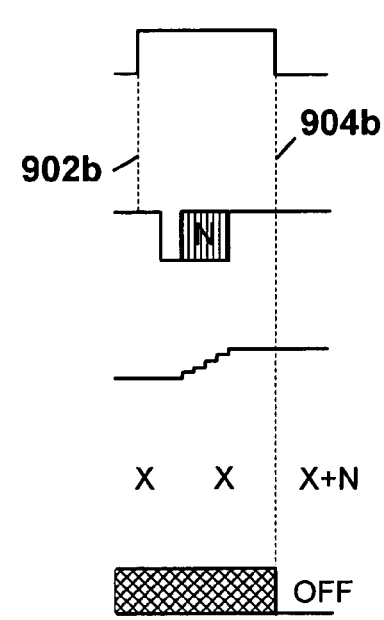
Figure 9C:
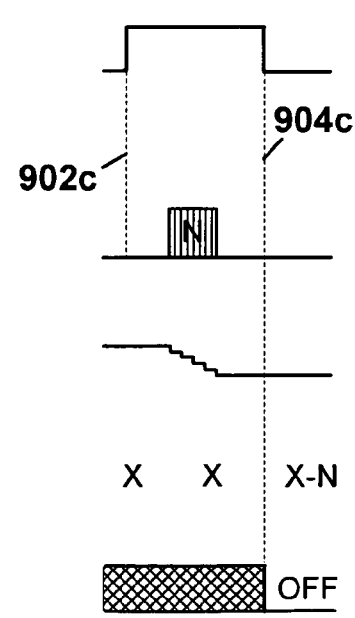

Referring now to FIGS. 9a–9c depicted are schematic signal diagrams of control signal sequences for disabling write protection of the non-volatile memory. In FIG. 9a the CS input 112 and the U/D input 114 are both at the second logic level. At time 902a, the CS input 112 is in a rising edge transition from the second logic level to the third logic level. At time 904a, the CS input 112 is in a falling edge transition from the third logic level to the second logic level and the U/D input 114 remains at the second logic level. Since the logic levels of the U/D input 114 are the same at times 902a and 904a, write protection of the non-volatile memory is disabled. Since the device parameter 110 has not been changed between times 902a and 904a, the contents of the non-volatile memory 108 remain the same.

In FIG. 9b the CS input 112 and the U/D input 114 are both at the second logic level. At time 902b, the CS input 112 is in a rising edge transition from the second logic level to the third logic level. At time 904b, the CS input 112 is in a falling edge transition from the third logic level to the second logic level and the U/D input 114 remains at the second logic level. Since the logic levels of the U/D input 114 are the same at times 902b and 904b, write protection of the non-volatile memory is disabled. Since the device parameter 110 has been increased, e.g., incremented, by N units between times 902b and 904b, the contents of the non-volatile memory 108 are updated to the new parameter value.

In FIG. 9c the CS input 112 is at the second logic level and the U/D input 114 is at the first logic level. At time 902c, the CS input 112 is in a rising edge transition from the second logic level to the third logic level. At time 904c, the CS input 112 is in a falling edge transition from the third logic level to the second logic level and the U/D input 114 remains at the first logic level. Since the logic levels of the U/D input 114 are the same at times 902c and 904c, write protection of the non-volatile memory is disabled. Since the device parameter 110 has been decreased, e.g., decremented by N units between times 902c and 904c, the contents of the non-volatile memory 108 are updated to the new parameter value.

It is contemplated and within the scope of the present invention that any two or more signal serial bus protocol may be utilized to change a parameter value(s), write the parameter value(s) to non-volatile memory, and enable and disable write protection of the non-volatile memory by utilizing any combination of three different logic levels on at least one of the two or more signal serial bus.

The invention, therefore, is well adapted to carry out the objects and attain the ends and advantages mentioned, as well as others inherent therein. While the invention has been depicted, described, and is defined by reference to exemplary embodiments of the invention, such references do not imply a limitation on the invention, and no such limitation is to be inferred. The invention is capable of considerable modification, alternation, and equivalents in form and function, as will occur to those ordinarily skilled in the pertinent arts and having the benefit of this disclosure. The depicted and described embodiments of the invention are exemplary only, and are not exhaustive of the scope of the invention. Consequently, the invention is intended to be limited only by the spirit and scope of the appended claims, giving full cognizance to equivalents in all respects.

What is claimed is:

1. An integrated circuit having a device with an adjustable parameter and a non-volatile memory for storing a present value of the adjustable parameter, comprising:
   control logic having a first input, a second input, a memory control output, a parameter control output and a write protect control output, wherein the first input is adapted for operating at first, second and third logic levels and the second input is adapted for operating at the first and second logic levels;
   a device with an adjustable parameter having a range of values, wherein the parameter control output causes the adjustable parameter to change within the range of values to a present value; and
   a non-volatile memory for storing the present value, wherein the memory control output causes the present value to be written to the non-volatile memory and the write protect control output enables and disables writing to the non-volatile memory.

2. The integrated circuit according to claim 1, wherein the third logic level is at a higher voltage than the second logic level and the second logic level is at a higher voltage than the first logic level.

3. The integrated circuit according to claim 2, wherein the third logic level is greater than or equal to about 7 volts, the second logic level is from about 2.7 volts to about 5.5 volts, and the first logic level is from about 0 volts to about 0.7 volts.

4. The integrated circuit according to claim 1, wherein the first input selects the device and the second input changes the adjustable parameter.

5. The integrated circuit according to claim 1, wherein the first and second inputs select whether the present value is written to the non-volatile memory.

6. The integrated circuit according to claim 1, wherein if the value of the adjustable parameter changes between when the first input goes from the second logic level to the third logic level and when the first input goes from the third logic level to the second logic level, then the present value is written to the non-volatile memory.

7. The integrated circuit according to claim 1, wherein the first and second inputs determine whether writing to the non-volatile memory is enabled or disabled.

8. The integrated circuit according to claim 7, wherein if the second input is at the second logic level when the first input goes from the second logic level to the third logic level and the second input is at the first logic level when the first input goes from the third logic level to the second logic level, then writing to the non-volatile memory is disabled.

9. The integrated circuit according to claim 7, wherein if the second input is at the first logic level when the first input goes from the second logic level to the third logic level and the second input is at the second logic level when the first input goes from the third logic level to the second logic level, then writing to the non-volatile memory is disabled.

10. The integrated circuit according to claim 7, wherein if the second input is at different logic levels when the first input goes from the second logic level to the third logic level and when the first input goes from third logic level to the second logic level, respectively, then writing to the non-volatile memory is disabled.

11. The integrated circuit according to claim 7, wherein if the second input is at the first logic level when the first input goes from the second logic level to the third logic level and then back to the second logic level, then writing to the non-volatile memory is enabled.

12. The integrated circuit according to claim 7, wherein if the second input is at the second logic level when the first input goes from the second logic level to the third logic level and then back to the second logic level, then writing to the non-volatile memory is enabled.

13. The integrated circuit according to claim 7, wherein if the second input is at the same logic level when the first input goes from the second logic level to the third logic level and then back to the second logic level, then writing to the non-volatile memory is enabled.

14. The integrated circuit according to claim 7, wherein the non-volatile memory is enabled or disabled by clearing or setting, respectively, a write protect bit.

15. The integrated circuit according to claim 7, wherein the non-volatile memory is enabled or disabled by setting or clearing, respectively, a write protect bit.

16. The integrated circuit according to claim 1, wherein the first and second inputs determine whether the value of the parameter increases or decreases.

17. The integrated circuit according to claim 1, wherein the non-volatile memory retains the present value upon loss of power to the device or low voltage to the device.

18. The integrated circuit according to claim 1, wherein the device is selected from the group consisting of a digital rheostat, a digital potentiometer, a digital counter, a programmable gain amplifier, a modulo N-frequency divider, and a digital-to-analog converter (DAC).

19. The integrated circuit according to claim 1, further comprising an integrated circuit package encapsulating the control logic, the device and the non-volatile memory.

20. The integrated circuit according to claim 19, wherein the integrated circuit package is selected from the group consisting of SOT-23-5, SOT-23-6, MSOP-8, and SOIC-8.

21. The integrated circuit according to claim 1, wherein the non-volatile memory is one time programmable (OTP) electrically programmable read only memory (EPROM).

22. The integrated circuit according to claim 1, wherein the non-volatile memory is electrically erasable and programmable read only memory (EEPROM).

23. The integrated circuit according to claim 1, wherein the non-volatile memory is FLASH memory.

24. The integrated circuit according to claim 1, wherein:
when the first input goes from the second logic level to the third logic level and the second input is at the first logic level,
then each time the second input goes from the first logic level to the second logic level the value of the adjustable parameter decreases.

25. The integrated circuit according to claim 1, wherein:
when the first input goes from the second logic level to the third logic level and the second input is at the second logic level,
then each time the second input goes from the first logic level to the second logic level the value of the adjustable parameter increases.

26. The integrated circuit according to claim 1, wherein:
when the first input goes from the second logic level to the third logic level and the second input is at the first logic level,
then each time the second input goes from the second logic level to the first logic level the value of the adjustable parameter decreases.

27. The integrated circuit according to claim 1, wherein:
when the first input goes from the second logic level to the third logic level and the second input is at the second logic level,
then each time the second input goes from the second logic level to the first logic level the value of the adjustable parameter increases.

28. A method of enabling and disabling write protection of a non-volatile memory in an integrated circuit device having an adjustable parameter, changing a value of the adjustable parameter and storing a present value of the adjustable parameter in the non-volatile memory using two control inputs, said method comprising the steps of:
determining whether a second control input is at a first or a second logic level when a first control input goes from the second logic level to a third logic level; and
determining whether the second control input is at the first or the second logic level when the first control input goes back to the second logic level from the third logic level; wherein:
if the second input is at the first logic level when the first input goes from the second logic level to a third logic level, and the second input is at the second logic level when first input goes back to the second logic level from the third logic level, then enable write protection of a non-volatile memory; and
if the second input is at the first logic level when the first input goes from the second logic level to a third logic level and then back to the second logic level from the third logic level, then disable write protection of the non-volatile memory.

29. A method of enabling and disabling write protection of a non-volatile memory in an integrated circuit device having an adjustable parameter, changing a value of the adjustable parameter and storing a present value of the adjustable parameter in the non-volatile memory using two control inputs, said method comprising the steps of:
determining whether a second control input is at a first or a second logic level when a first control input goes from the second logic level to a third logic level; and
determining whether the second control input is at the first or the second logic level when the first control input goes back to the second logic level from the third logic level; wherein:
if the second input is at the second logic level when the first input goes from the second logic level to a third logic level, and the second input is at the first logic level when first input goes back to the second logic level from the third logic level, then enable write protection of a non-volatile memory; and
if the second input is at the second logic level when the first input goes from the second logic level to a third logic level and then back to the second logic level from the third logic level, then disable write protection of the non-volatile memory.

30. A method of enabling and disabling write protection of a non-volatile memory in an integrated circuit device having an adjustable parameter, changing a value of the adjustable parameter and storing a present value of the adjustable parameter in the non-volatile memory using two control inputs, said method comprising the steps of:
determining whether a second control input is at a first or a second logic level when a first control input goes from the second logic level to a third logic level; and
determining whether the second control input is at the first or the second logic level when the first control input goes back to the second logic level from the third logic level; wherein:
if the second input is at different logic levels when the first input goes from the second logic level to a third logic level, and then back to the second logic level from the third logic level, respectively, then enable write protection of a non-volatile memory; and
if the second input is at the same logic level when the first input goes from the second logic level to a third logic level and then back to the second logic level from the third logic level, then disable write protection of the non-volatile memory.

31. The method according to claim 30, wherein the adjustable parameter is selected from the group consisting of resistance, voltage, current, frequency, frequency division and amplifier gain.

32. The method according to claim 30, wherein the third logic level is at a higher voltage than the second logic level and the second logic level is at a higher voltage than the first logic level.

33. The method according to claim 32, wherein the third logic level is greater than or equal to about 7 volts, the second logic level is from about 2.7 volts to about 5.5 volts, and the first logic level is from about 0 volts to about 0.7 volts.

34. The method according to claim 30, further comprising the step of writing the present value of the adjustable parameter to the non-volatile memory when the first input goes back to the second logic level from the third logic level.

35. The method according to claim 30, further comprising the steps of:
   determining when the first input goes from the second logic level to the third logic level; and
   determining whether the second input is at the first or second logic level when the first input goes from the second logic level to the third logic level; wherein:
   if the second input is at the first logic level when the first input goes from the second logic level to the third logic level, then
   decreasing the value of the adjustable parameter each time the second input goes from the first logic level to the second logic level; and
   if the second input is at the second logic level when the first input goes from the second logic level to the third logic level, then
   increasing the value of the adjustable parameter each time the second input goes from the first logic level to the second logic level.

* * * * *